US011474163B2

(12) United States Patent
He et al.

(10) Patent No.: US 11,474,163 B2
(45) Date of Patent: Oct. 18, 2022

(54) POWER TRANSFORMER WINDING FAULT POSITIONING METHOD BASED ON DEEP CONVOLUTIONAL NEURAL NETWORK INTEGRATED WITH VISUAL IDENTIFICATION

(71) Applicant: WUHAN UNIVERSITY, Hubei (CN)

(72) Inventors: Yigang He, Hubei (CN); Jiajun Duan, Hubei (CN); Bolun Du, Hubei (CN); Hui Zhang, Hubei (CN); Liulu He, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 428 days.

(21) Appl. No.: 16/729,563

(22) Filed: Dec. 30, 2019

(65) Prior Publication Data
US 2021/0048487 A1 Feb. 18, 2021

(30) Foreign Application Priority Data
Aug. 12, 2019 (CN) .......................... 201910740874.3

(51) Int. Cl.
*G01R 31/62* (2020.01)
*G06F 17/14* (2006.01)
*G06N 3/08* (2006.01)

(52) U.S. Cl.
CPC ............. *G01R 31/62* (2020.01); *G06F 17/14* (2013.01); *G06N 3/08* (2013.01)

(58) Field of Classification Search
CPC ........ G01R 31/62; G01R 31/72; G01R 31/00; G06F 17/14; G06N 3/08; G06N 3/0454; G06K 9/6256; G06K 9/6267
See application file for complete search history.

(56) References Cited

FOREIGN PATENT DOCUMENTS

| CN | 108510002 | * | 9/2018 |
| CN | 108693437 | * | 10/2018 |
| CN | 109657720 | * | 12/2018 |

OTHER PUBLICATIONS

Luo et al. "Recognition Technology of Winding Deformation Based on Principal Components of Transfer Function Characteristics and Artificial Neural Network", IEEE Transactions on Dielectrics and Electrical Insulation (Year: 2017).*

(Continued)

*Primary Examiner* — Qian Yang
(74) *Attorney, Agent, or Firm* — JCIPRNET

(57) ABSTRACT

The disclosure discloses a power transformer winding fault positioning method based on deep convolutional neural network integrated with visual identification, including 1) a winding equivalent circuit is established, and a transfer function thereof is calculated; 2) a sine wave excitation source is set at one end of the power transformer winding to obtain the amplitude-frequency characteristic curve of each winding node; 3) circuits under various fault statuses are subjected to scanning frequency response analysis to extract amplitude-frequency characteristics; 4) a feature matrix is established based on the obtained amplitude-frequency characteristics; 5) scanning frequency response analysis is performed on the diagnosed power transformer to form a feature matrix; 6) the feature matrix is converted into an image, simulation and historical detection data are used as a training set, and a deep convolutional neural network is input for training; 7) diagnosed transformer is subjected to fault classification and positioning.

10 Claims, 8 Drawing Sheets

(56) References Cited

OTHER PUBLICATIONS

Qin et al. "Research of Fault Diagnosis and Location of Power Transformer Based on Convolutional Neural Network", 2019 IEEE PES Innovative Smart Grid Technologies Asia (Year: 2019).*
Moradzadeh et al. "Short Circuit Location in Transformer Winding Using Deep Learning of Its Frequency Responses", 2019 International Aegean Conference on Electrical Machines and Power Electronics (ACEMP) (Year: 2019).*
Birlasekaran et al. "Diagnosis and Identification of Transformer Faults from Frequency Response Data", 2000 IEEE Power Engineering Society Winter Meeting. Conference Proceedings (Year: 2000).*
Rahimpour et al., "A new method for comparing the transfer function of transformers in order to detect the location and amount of winding faults", Electrical Engineering vol. 88, pp. 411-416 (Year: 2006).*
Machine translation of CN 108510002 (Year: 2018).*
Machine translation of CN 108693437 (Year: 2018).*
Machine translation of CN 109657720 (Year: 2018).*

\* cited by examiner

POWER TRANSFORMER WINDING FAULT POSITIONING METHOD BASED ON DEEP CONVOLUTIONAL NEURAL NETWORK INTEGRATED WITH VISUAL IDENTIFICATION

CROSS REFERENCE TO RELATED APPLICATION

This application claims the priority benefits of China application serial no. 201910740874.3, filed on Aug. 12, 2019. The entirety of the above-mentioned patent application is hereby incorporated by reference herein and made a part of specification.

BACKGROUND

Technical Field

The disclosure relates to a power transformer winding fault positioning method, in particular to a power transformer winding fault positioning method based on deep convolutional neural network integrated with visual identification.

Description of Related Art

Transformer is the most important equipment in power system, and its safe and reliable operation is very important. With continuous development of domestic power grid construction, the operation environment of transformers is becoming more and more complicated. Once a small failure occurs, it may lead to tremendous losses. According to statistics from the International Large Power Grid Working Group, winding deformation accounts for 30% of all the factors causing transformer failure, and which is the major factor. Transformer winding failure in the early stage will not cause a significant impact on equipment operation, but if not handled in time, there might be severe consequences. Therefore, domestic and foreign practitioners have carried out a large scale of research on transformer winding fault detection. Specifically, FRA has received a lot of attention because it is a non-intrusive test and is very sensitive to the occurrence of faults. Even small changes in parameters can be reflected on the frequency response curve.

At present, few studies are focused on the classification of transformer winding fault, and the research on fault positioning methods is almost none. In 2018, a fault classification model integrated with decision tree and ANN was established by Sajad Bagheri and others to distinguish between transformer winding mechanical faults, internal/external faults and inrush current. Zou Lin and others at Chongqing University established a winding model of transformer through finite element simulation in 2017, studied the influence brought by the winding under different deformation conditions on parameters, and obtained corresponding frequency response curves. Obviously, in the actual detection process, not only the presence of the fault needs to be identified, it is also necessary to provide the fault location information for the intelligent monitoring network as much as possible. An effective fault positioning method is to compare the FRA simulation characteristics of different nodes with the monitoring response curve, and to calibrate the fault type based on the calculation results and operating experience. Hanif Tavakoli in his doctoral dissertation tried to introduce higher scanning frequency (2 MHz) and a new method combining FRA and TDR (time domain reflection technology) to enhance the feature extraction of fault location information. In addition, there is another FRA positioning method: MandiKhanali et al. proposed in 2017 to artificially set the internal short-circuit fault location of the transformer winding and study the influence regularity of different fault locations on its frequency response curve to obtain classification of different fault types. However, these methods not only need to test different fault conditions of specific transformers, but also need to quantitatively calculate uncertain statistical parameters for trend analysis of fault locations, which to a large extent limits the applicability of fault diagnosis methods.

The deep learning-based feature extraction method can intelligently identify fault features, and training can be continuously carried out through multi-layer convolutional neural networks and monitoring samples, therefore its accuracy is also continuously improved. Transformer FRA detection is very sensitive and can reflect small changes in parameter. If statistical parameters are used to quantitatively identify fault features, there may be more errors, and the multi-layer structure of deep convolutional neural networks can overcome this problem well. In addition, the detection response waveform is converted into a feature image, which can highlight the characteristics of the amplitude change and facilitate the adjustment of the input characteristics of the convolutional neural network. Therefore, the in-depth and intelligent fault detection method is the trend in development of future equipment detection.

SUMMARY

In order to overcome the defects in the related technology, the present disclosure provides a power transformer winding fault positioning method based on deep convolutional neural network integrated with visual identification, which has high fault positioning accuracy and is more intelligent.

The power transformer winding fault positioning method based on deep convolutional neural network integrated with visual identification provided by the present disclosure includes the following steps:

1) The power transformer is equivalent to a two-port network, a winding equivalent circuit is established, and its transfer function is calculated;

2) For the winding equivalent circuit in the normal state of the circuit parameters, a sine wave excitation source with a changing frequency is set at one end of the power transformer winding to obtain the amplitude-frequency characteristic curve of each winding node in the normal state;

3) Circuits under various fault statuses, i.e., of which different element parameters are varied, are subjected to scanning frequency response analysis to extract amplitude-frequency characteristics, and calculation is performed to obtain the amplitude-frequency characteristics of each winding node in different fault conditions;

4) Based on the amplitude-frequency characteristics obtained in step 2) and step 3), the frequency change amount is set as the abscissa, and different winding node numbers from the input terminal to the output terminal of scanning frequency is set as the ordinate to establish the feature matrix;

5) Perform a scanning frequency response analysis on the power transformer to be diagnosed, obtain the amplitude-frequency characteristics, and collect its historical detection data to form a feature matrix according to the method in step 4);

6) The feature matrix obtained in step 4) and step 5) is converted into an image, and simulation and historical detection data are used as a training set, and a fault category and a fault location are used as labels, and a deep convolutional neural network is input for training;

7) Use the trained network to classify and position the fault of the transformer to be diagnosed.

Further to the above technical solution, the process of calculating the transfer function in step 1) mainly includes the following steps:

① Select the first and last node voltages $V_i$ and current $I_i$ of each winding as state variables, C is the inter-turn capacitance value, L is the inter-turn inductance value, and $C_g$ is the ground capacitance. For the i-th node and its adjacent node, Lerhoff's law is used as follows:

$$\begin{cases} I_i - I_{i+1} = C\frac{d(V_i - V_{i-1})}{dt} + C_g \frac{d}{dt}V_i \\ V_i - V_{i-1} = L\frac{d}{dt}I + RI_i \end{cases}$$

② Extend step ① to all nodes, make T and Γ be the transformer winding parameter matrix, then;

$$\begin{cases} T \cdot I = C \cdot \dot{V} \\ \Gamma V = L\dot{I} + RI \end{cases}$$

③ Make node 1 be the input voltage $V_1$ and extract it when calculating the transfer function. O is the column vector when the first row is removed from C, P is the corresponding column vector of Γ, then;

$$\begin{cases} \frac{d}{dt}\begin{pmatrix} U \\ I \end{pmatrix} = \begin{pmatrix} 0 & C^{-1}T \\ -L^{-1}\Gamma & -L^{-1}R \end{pmatrix}\begin{pmatrix} U \\ I \end{pmatrix} + \begin{pmatrix} -C^{-1}O\frac{d}{dt} \\ L^{-1}P \end{pmatrix}V_1 \end{cases}$$

④ After simplification, it can be obtained that: $j\omega E \cdot X = AX + BV_1$, wherein $$X = \begin{pmatrix} U \\ I \end{pmatrix},$$

$$j\omega = \frac{d}{dt}, A = \begin{pmatrix} 0 & C^{-1}T \\ -L^{-1}\Gamma & -L^{-1}R \end{pmatrix}, \text{ and } C = \begin{pmatrix} -C^{-1}O\frac{d}{dt} \\ L^{-1}P \end{pmatrix},$$

which is converted into the frequency domain, then $$TF(\omega) = \frac{X}{V_1} = (j\omega E - A)^{-1}B.$$

Following the above technical solution, the calculation process of the amplitude response characteristic of the equivalent circuit of the transformer winding in step 2)-step 3) is as follows:

After inputting the circuit parameters of the transformer, set the loop according to the formula in step ④. First, calculate the transfer function value under the condition that the voltage frequency at input terminal is changed from 1 to 1 MHz under normal parameters. When the fault state changes, the circuit amplitude response curve is slightly different, the amplitude response for different fault types and different fault locations is calculated and obtained through two-layer loop statements.

Following the above technical solution, the process of establishing a feature matrix in step 4) is specifically as follows:

Number the locations of the monitoring nodes at the output terminal, and record the amplitude-frequency characteristics of the i-th node as $TF_i(\omega)$. The fault type is defined according to the actual situation and is represented by the subscript m. The fault location is the position of different nodes of the winding and is represented by the subscript n. The feature matrix of fault type m fault location n is:

$$TF_{mn} = \begin{pmatrix} TF_1(\omega_1) & TF_1(\omega_2) & \ldots & TF_1(\omega_{n-1}) & TF_1(\omega_n) \\ TF_2(\omega_1) & TF_2(\omega_2) & \ldots & TF_3(\omega_{n-1}) & TF_2(\omega_n) \\ & & \vdots & & \\ TF_i(\omega_1) & TF_i(\omega_2) & \ldots & TF_i(\omega_{n-1}) & TF_i(\omega_n) \end{pmatrix}$$

The feature matrix under normal state is recorded as $TF_{00}$.

Further to the above technical solution, in step 6), the data set is trained by using a deep convolutional neural network, and a deep convolutional neural network model is used to learn data features;

The feature map obtained through the last pooling layer is used as the input of the fully connected layer, and (fault type m)×(fault location n)+1 is replaced by the total output of the fully connected layer (the last layer of a few networks such as SqueezeNet is a convolutional layer, then replace it with a new convolutional layer, and the number of filters in the new convolutional layer is equal to the number of diagnostic label categories) for integration calculation;

The fault is identified through the classifier. The labels of different fault categories are different fault locations and fault types.

Further to the above technical solution, the frequency change of the sine wave excitation source is 1~1 MHz.

Further to the above technical solutions, the faults include longitudinal capacitor failure, vertical inductor failure, and abnormal ground capacitor and so on. In practice, it is only necessary to detect the existence and location of the fault. The fault label can be set according to the type of fault that needs to be focused on.

Further to the above technical solution, after the feature matrix is converted into an image, the image is subjected to image processing such as adding noise, cutting transformation, rotation, mirroring, and grayscale according to network training requirements to expand the data set to be trained.

Further to the above technical solution, logarithmic processing is performed on the values in the feature matrix. If the value of a random element in the feature matrix is $x_k$, the processed value is:

$x_k' = 20\log_{10}(x_k)$.

Further to the above technical solution, in step 6), the feature matrix is drawn into a colored image according to the color bar, and the size is unified.

Advantageous effects of using the present disclosure: The present disclosure uses a deep convolutional neural network integrated with visual identification method to extract and classify the fault features of power transformer windings, which can achieve comprehensive diagnosis of fault detection, fault type identification, and fault classification. As long as the standard parameters of the transformer are obtained, various fault states can be simulated to provide corresponding data support for diagnosis, and the remaining parameters can be intelligently optimized during the network training process.

In addition, the graphical representation of the frequency response curve of the present disclosure can highlight features, thereby improving positioning accuracy and providing a more intuitive result.

Further, the image processing methods are more diverse. By performing operations such as adding noise, cutting transformation, rotation, mirroring, and grayscale, the data set can be expanded, and simulation degree of training can be optimized. By labeling of location information, the positioning problem can be converted into classification problem to facilitate the convolutional neural network to perform fault diagnosis. Distributed network training is incorporated with transfer learning, the underlying network is trained with simulation data, and the detection response data is further refined, such that the problem of insufficient test sample of scanning frequency response of transformer winding can be compensated in actual operation condition.

DESCRIPTION OF THE EMBODIMENTS

Next, the present disclosure will be further described with reference to the drawings and embodiments.

The disclosure can effectively realize identification and positioning of the fault of transformer windings; overcome the shortcomings that conventional scanning frequency response analysis relies too much on expert experience to determining fault and there is no unified standard; use convolutional neural network for intelligent classification to simplify the application difficulty, improve reliability, applicability and positioning accuracy. The disclosure proposes a power vision method for converting a detected waveform into an image and using a convolutional neural network for fault diagnosis, which can intuitively reflect the fault feature, make the data type suitable for the input requirements of the convolutional neural network, and the output result is easy to be observed and verified.

Figure 1:
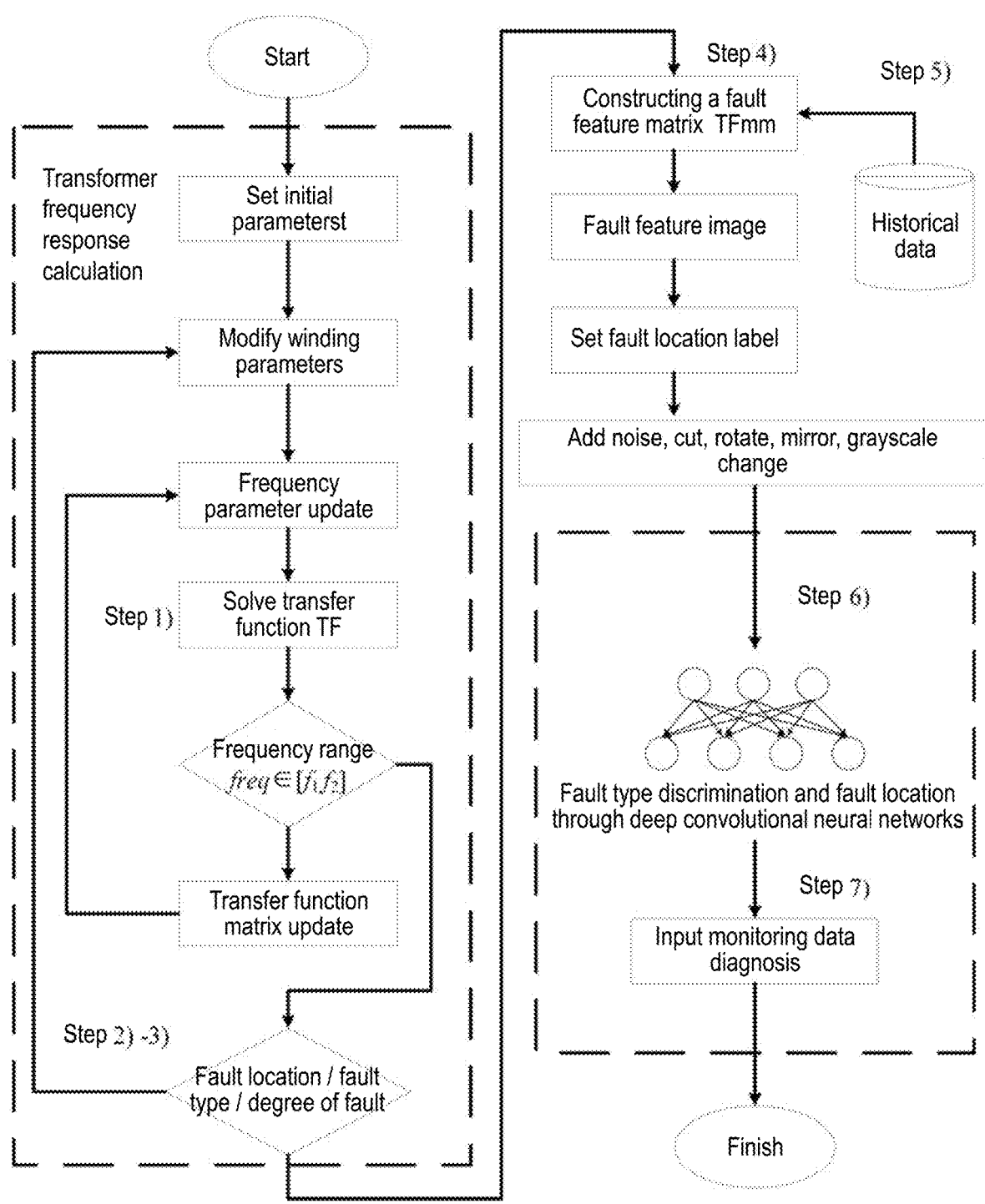
FIG. 1 is a block diagram of a power transformer winding fault positioning process based on deep convolutional neural network integrated with visual identification according to an embodiment of the present disclosure.

As shown in FIG. 1, the power transformer winding fault positioning method based on deep convolutional neural network integrated with visual identification provided in the embodiment of the present disclosure includes the following steps:

1) The power transformer is equivalent to a two-port network, a winding equivalent circuit is established, and its transfer function is deduced;

2) For the circuit in the normal state of the circuit parameters, a sine wave excitation source with a changing frequency (1~1 MHz) is set at one end of the transformer winding to obtain the amplitude-frequency characteristic curve of each winding node;

3) Circuits under various fault statuses, i.e., of which different element parameters are varied, are subjected to scanning frequency response analysis to extract amplitude-frequency characteristics, and calculation is performed to obtain the amplitude-frequency characteristics of each winding node;

4) Based on the amplitude-frequency characteristics obtained in step 2) and step 3), the frequency change amount is set as the abscissa, and different winding node numbers from the input terminal to the output terminal of scanning frequency is set as the ordinate to establish a feature matrix;

5) Perform a scanning frequency response analysis on the power transformer to be diagnosed, obtain the amplitude-frequency characteristics, and collect its historical detection data to form a feature matrix according to the method in step 4);

6) The feature matrix obtained in step 4) and step 5) is converted into an image, and simulation and historical detection data are used as a training set, and a fault category and a fault location are used as labels, and a deep convolutional neural network is input for training;

7) Use the trained network to classify and position the fault of the transformer to be diagnosed.

The process of calculating the transfer function in step 1) mainly includes the following steps:

First solve the transfer function of the transformer winding. Select the first and last node voltages $V_i$ and current $I_i$ of each winding as state variables, C is the inter-turn capacitance value, L is the inter-turn inductance value, and $C_g$ is the ground capacitance. For the i-th node and its adjacent node, Lerhoff's law is used as follows:

$$\begin{cases} I_i - I_{i+1} = C\frac{d(V_i - V_{i-1})}{dt} + C_g \frac{d}{dt}V_i \\ V_i - V_{i-1} = L\frac{d}{dt}I + RI_i \end{cases}$$

② Extend step ① to all nodes, make T and Γ be the transformer winding parameter matrix, then;

$$\begin{cases} T \cdot I = C \cdot \dot{V} \\ \Gamma V = L\dot{I} + RI \end{cases}$$

③ Make node 1 be the input voltage $V_1$ and extract it when calculating the transfer function. O is the column vector when the first row is removed from C, P is the corresponding column vector of Γ, then;

$$\left\{\frac{d}{dt}\begin{pmatrix}U\\I\end{pmatrix}=\begin{pmatrix}0 & C^{-1}T\\-L^{-1}\Gamma & -L^{-1}R\end{pmatrix}\begin{pmatrix}U\\I\end{pmatrix}+\begin{pmatrix}-C^{-1}O\dfrac{d}{dt}\\L^{-1}P\end{pmatrix}V_1\right.$$

④ After simplification, it can be obtained that: $j\omega E \cdot X = AX + BV_1$, wherein $$X = \begin{pmatrix}U\\I\end{pmatrix},$$

$$j\omega = \frac{d}{dt},\ A = \begin{pmatrix}0 & C^{-1}T\\-L^{-1}\Gamma & -L^{-1}R\end{pmatrix},\ \text{and}\ C = \begin{pmatrix}-C^{-1}O\dfrac{d}{dt}\\L^{-1}P\end{pmatrix},$$

which is converted into the frequency domain, then $$TF(\omega) = \frac{X}{V_1} = (j\omega E - A)^{-1} B.$$

Set the initial parameters: Use the parameters provided by the transformer manufacturer or the parameters measured under normal operating conditions as the initial values to calculate the initial transfer function value; then increase the frequency continuously (typically 1 to 1 MHz). Calculate the transfer function at that frequency value every time after the frequency parameter is updated. Finally combine the transfer function values at all frequencies and all monitoring points to form the transfer function matrix in the initial state.

In the present disclosure, a transfer learning method is adopted for compensation. The code is written according to the above transfer function formula. The frequency response curve of the transformer winding FRA can be obtained through simulation. First, the simulation data is used for network training. On this basis, the actual measurement response curve can be utilized continuously to refine the training on the originally trained network so as to continuously improve the accuracy through the transfer learning method.

The amplitude response characteristics of the transformer winding equivalent circuit in the step 2) to step 3) can be calculated through a matlab program. After inputting the circuit parameters of the transformer, like the method in step 1) above, the amplitude response of different fault types and different fault locations can be obtained through two-layer loop statements. Set different fault types and different fault locations, and modify the transformer winding parameters accordingly. Update the frequency parameter to zero every loop, and calculate the transfer function matrix under the condition that the voltage frequency at input terminal is changed from 1 to 1 MHz in each fault state. If the requirement for diagnostic accuracy is higher, set further loop for the same fault location and fault type to specifically sort the degree of faults.

In step 4)-step 5), the detection waveform is converted into an image, and a convolutional neural network is used for feature extraction and pattern recognition for fault diagnosis. The method for establishing a feature matrix and the image processing method are as follows. First, the output terminal monitoring nodes are numbered according to their locations, the amplitude-frequency characteristics of the i-th node are recorded as $TF_i(\omega)$. The fault type is defined according to the actual situation, such as longitudinal capacitor failure, vertical inductor failure, and abnormal ground capacitor, etc., which are represented by the subscript m; the fault location is the positions of different nodes of the winding, which are represented by the subscript n. Then the feature matrix of fault type m fault location n is:

$$TF_{mn} = \begin{pmatrix} TF_1(\omega_1) & TF_1(\omega_2) & \dots & TF_1(\omega_{n-1}) & TF_1(\omega_n)\\ TF_2(\omega_1) & TF_2(\omega_2) & \dots & TF_3(\omega_{n-1}) & TF_2(\omega_n)\\ & & \vdots & & \\ TF_i(\omega_1) & TF_i(\omega_2) & \dots & TF_i(\omega_{n-1}) & TF_i(\omega_n) \end{pmatrix}$$

The feature matrix under normal state is $TF_{00}$. In order to improve the recognition of fault features, the values are logarithmic processed. Set the value of a random element of the feature matrix $TF_{mn}$ be $x_k$, then the processed value is $x_k' = 20\log_{10}(x_k)$. The numerical matrix is drawn into a colored image according to the color bar, and the size is unified as 224×224×3. In order to prevent overfitting problem during the training process of deep convolutional neural networks, addition of noise, cutting transformation, rotation, mirroring, grayscale and other operations are randomly performed on the monitored image data set to expand the data set to be trained. The monitoring sensor is placed on the winding node k, where k is a partial row of $TF_{mn}$, that is, $TF_{mn\_k}$ represents the k-th row of the $TF_{mn}$ matrix. In actual application, according to the distribution of sensors, the partial image is used as the final training test data set.

In step 6), the dataset is trained through a deep convolutional neural network. The deep convolutional neural network has good generalization ability, and can automatically adjust optimization parameters, which is suitable for the extraction of subtle features and determining which fault type that the power equipment status belongs to. Therefore, by converting the fault location into a fault label, a deep convolutional neural network can be used to implement identification of transformer winding fault; a convolutional neural network model is used to extract data features. The feature map obtained through the last pooling layer is used as the input of the fully connected layer, and (fault type m)×(fault location n)+1 is replaced by the total output of the fully connected layer (the last layer of a few networks such as SqueezeNet is a convolutional layer, then replace it with a new convolutional layer, and the number of filters in the new convolutional layer is equal to the number of diagnostic label categories) for integration calculation. Finally, the fault is identified by the classifier, and the labels of different types of fault are different fault locations and fault types, thereby realizing detection and positioning of faults.

Figure 2:
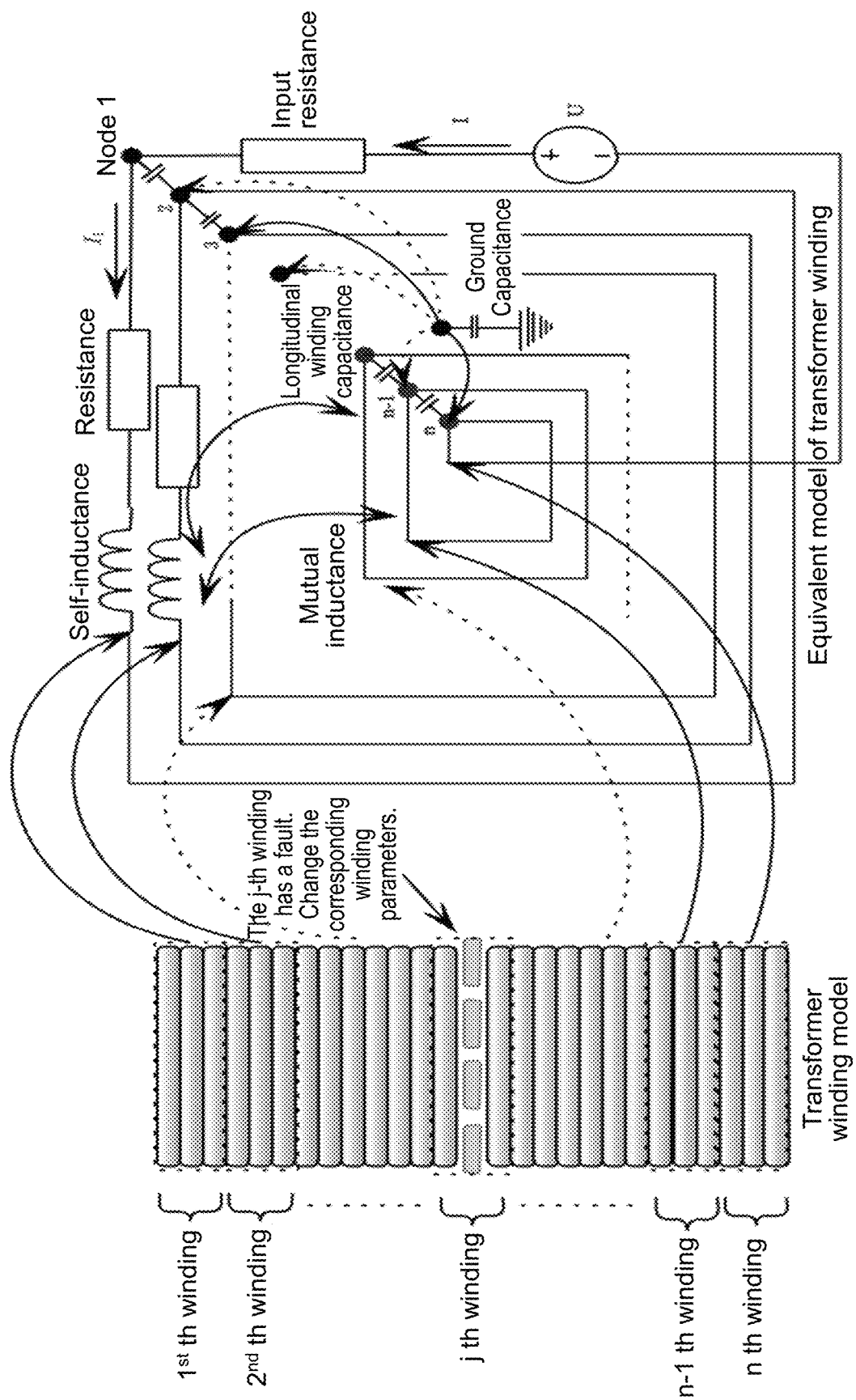
FIG. 2 is a transformer winding parameter equivalent method according to an embodiment of the present disclosure.
Figure 3A:
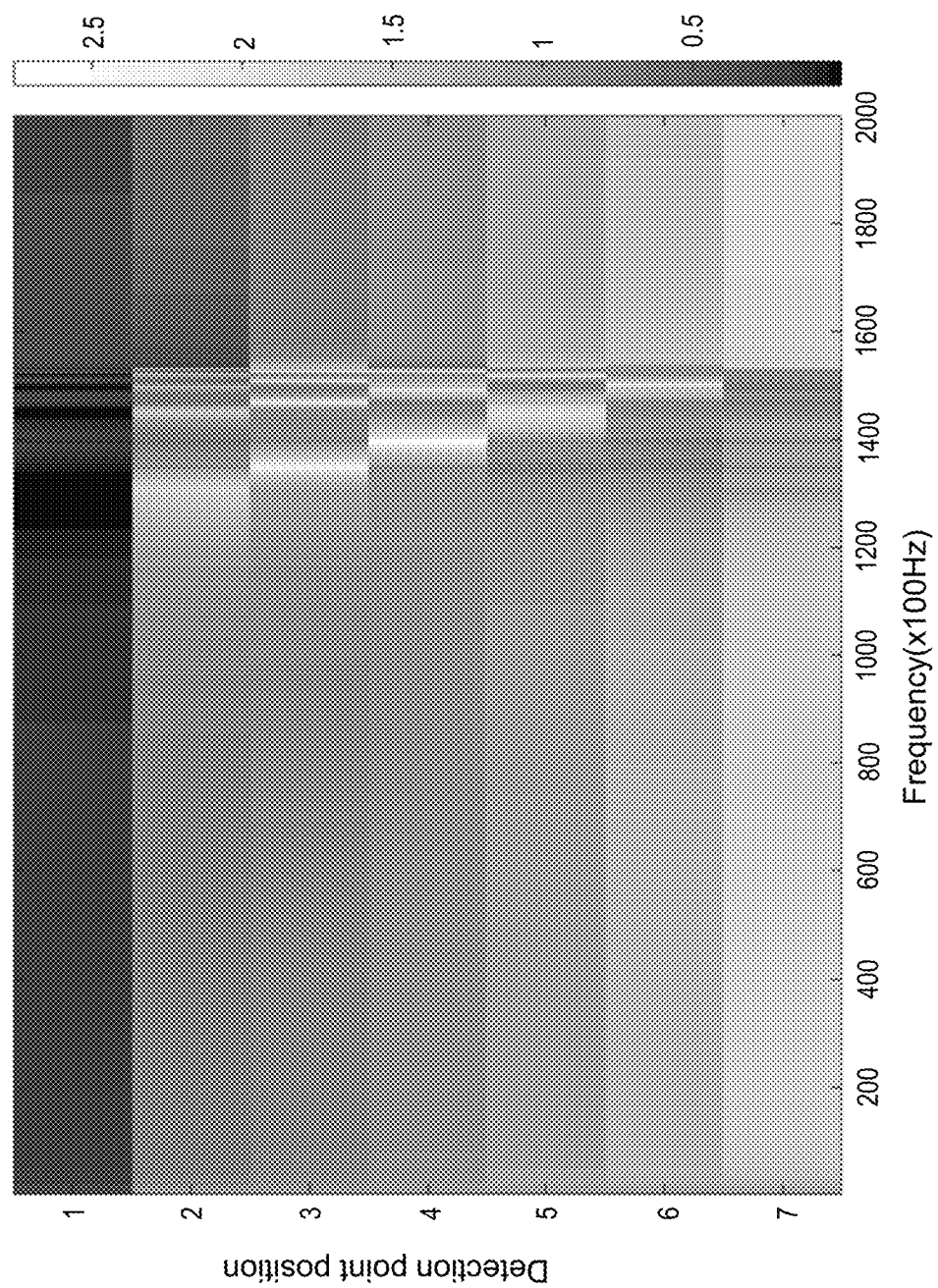
FIG. 3(a) is a frequency response image of a transformer in a normal operating state according to the present disclosure.

The Implementation Examples of the Present Disclosure are as Follows:

First, according to the transformer winding equivalent method shown in FIG. 2, the winding part of the transformer to be diagnosed is divided into n pieces evenly. N=7 in this example. According to the parameters of the transformer to be tested, a winding model was established, which takes mutual inductance, transformer oil, iron core and high voltage bushing into consideration, and its transfer function $TF(\omega)=(j\omega E-A)^{-1}B$ was derived according to step 1). In the actual measurement of winding, the uneven distribution of the same parameter values of n windings has almost no effect on the overall frequency response, so its normal state can be set to the same value. The frequency response of different detection nodes in the normal state of the transformer winding is calculated, and the feature matrix is established according to step 4)-step 5) and shown through the image processing method, as shown in FIG. 3(a).

Figure 3B:
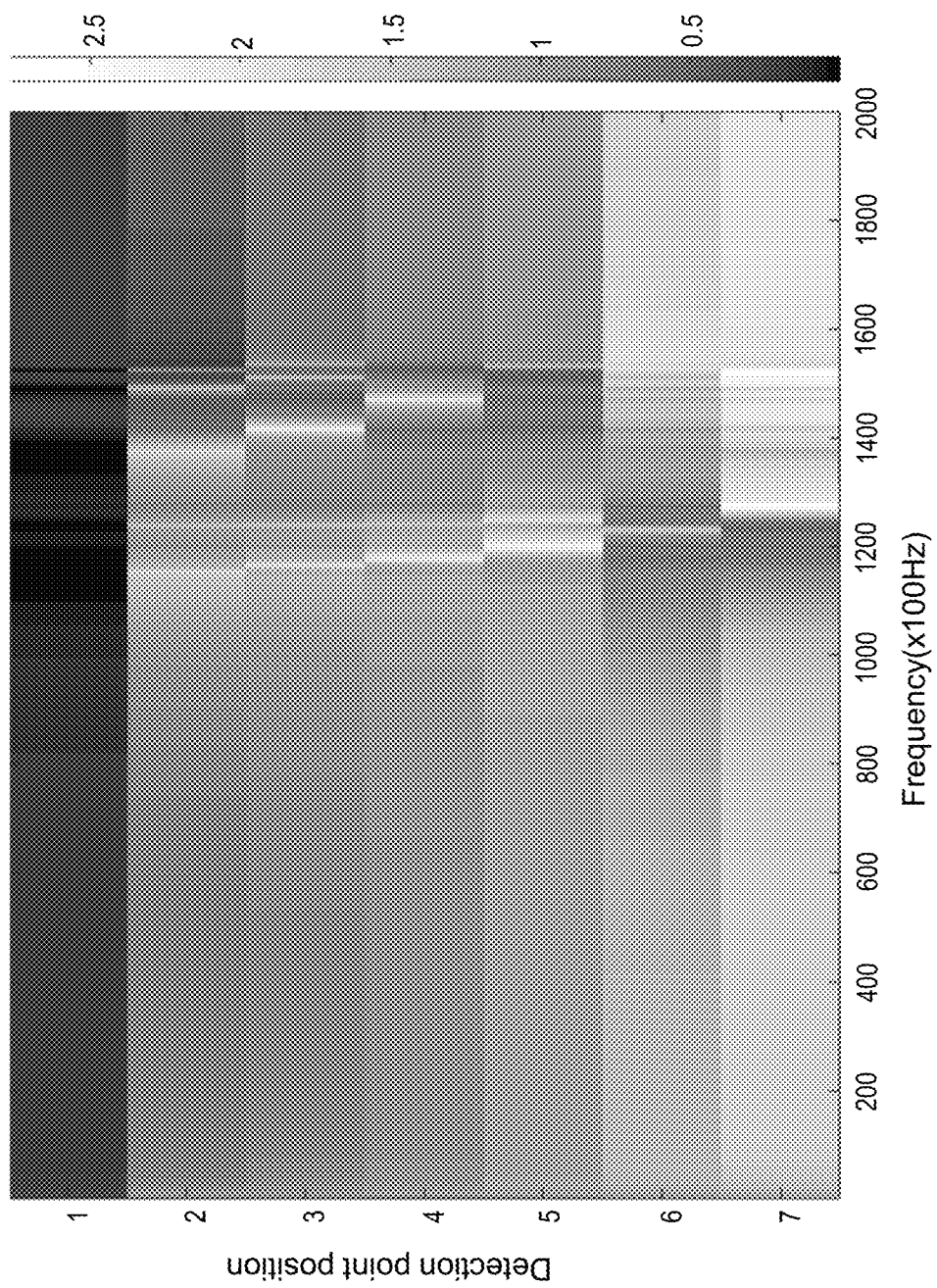
FIG. 3(b) is a frequency response diagram of the transformer winding when the longitudinal capacitor C of the present disclosure fails (fault location n=6).
Figure 3C:
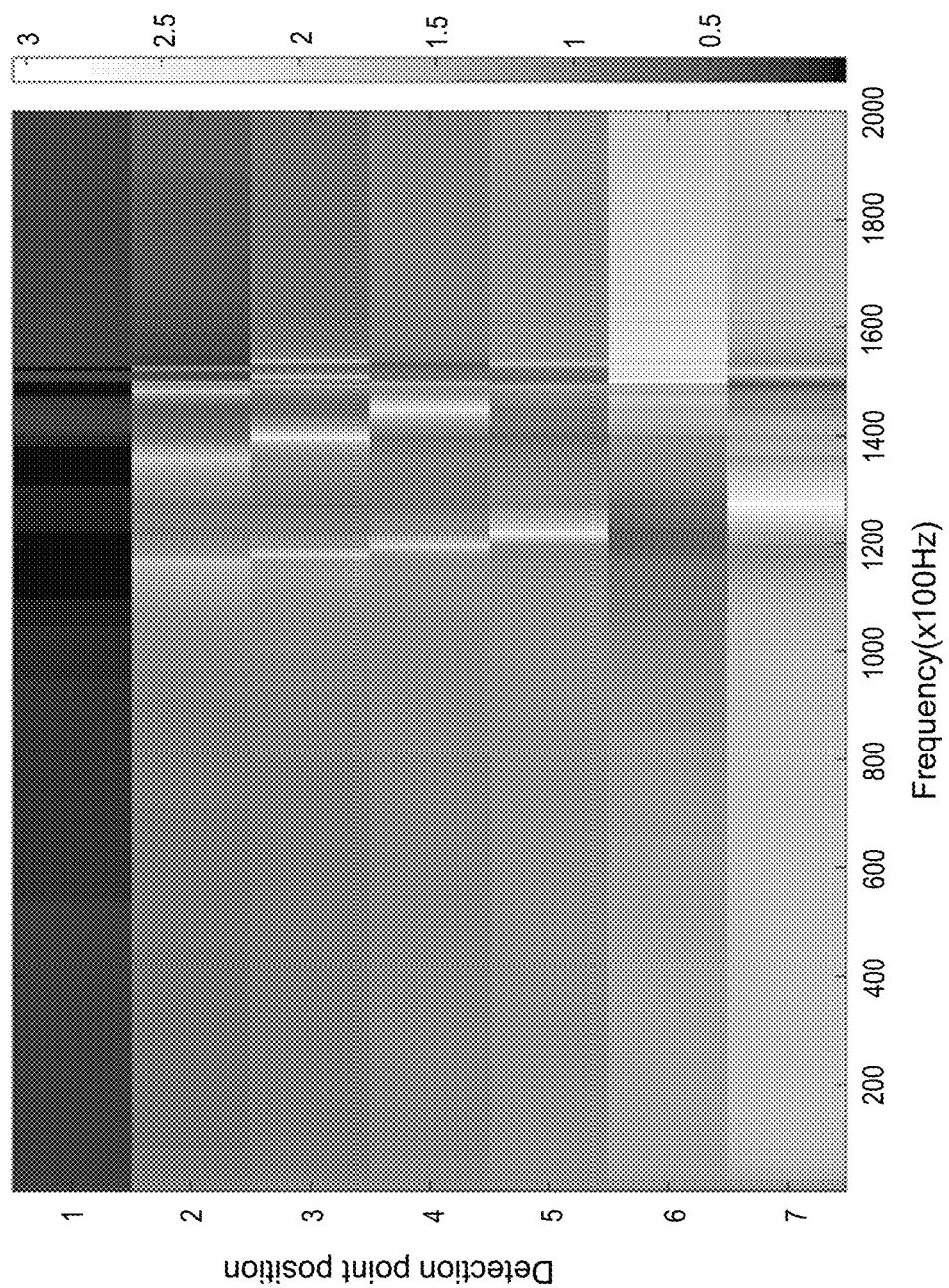
FIG. 3(c) is a frequency response diagram of the transformer winding when the ground capacitor $C_g$ of the present disclosure is abnormal (fault location n=6).
Figure 3D:
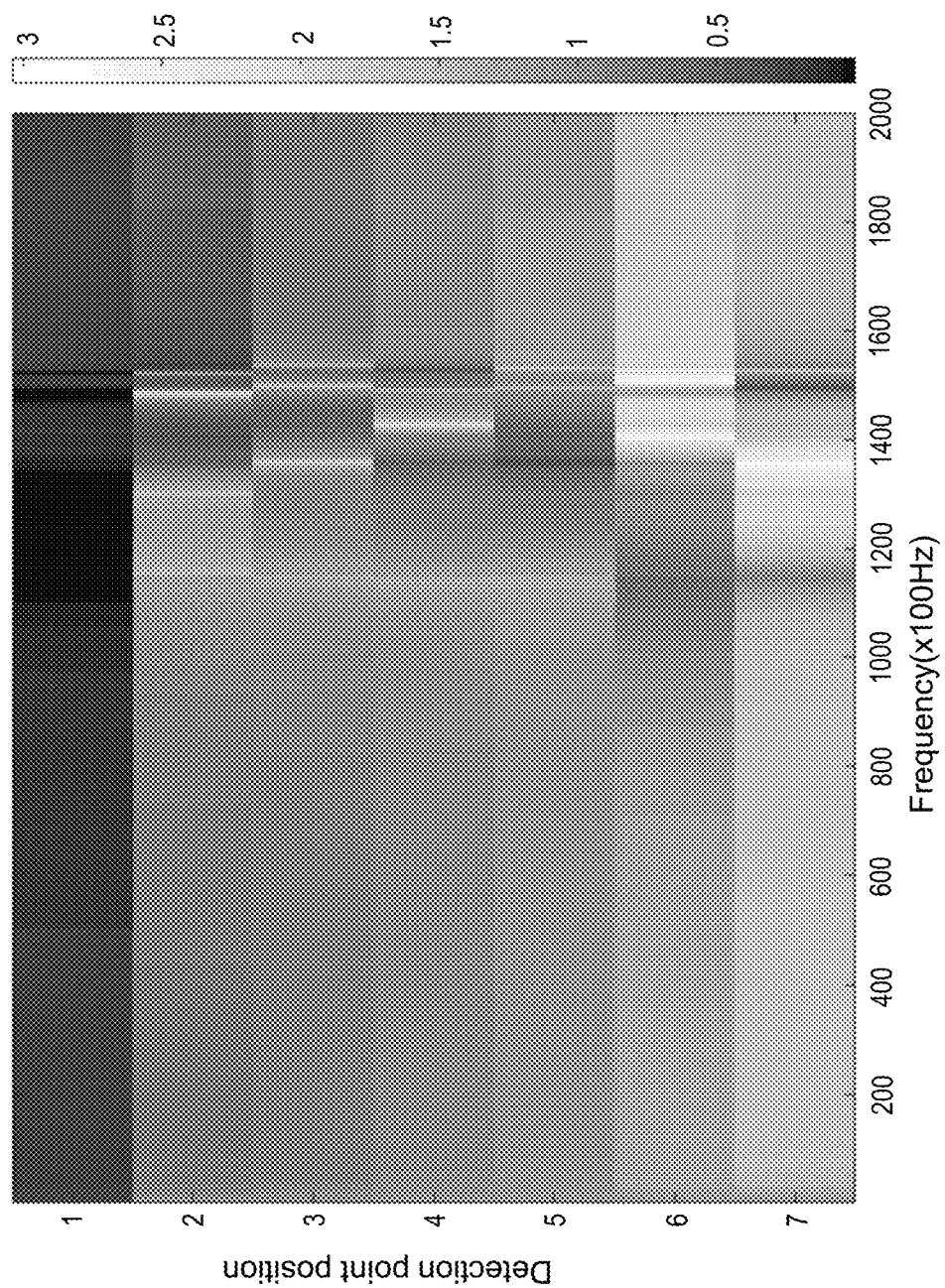
FIG. 3(d) is a frequency response diagram of the transformer winding when the longitudinal inductance L of the present disclosure fails (fault location n=6).

The fault parameters are further set to obtain a large number of response images and build the underlying learning information data set. In this embodiment, the following three types of faults are set: the longitudinal capacitor C fails, and the corresponding capacitance value is set to 1.5 times the original; the ground capacitor $C_g$ fails, and the ground capacitance of corresponding winding is set to 1.5 times the original, and the inductor L fails, and the inductance is set to 1.2 times the original. According to the measurement, the longitudinal capacitance value under standard conditions is C=1089.8 pF, the ground capacitance $C_g$ is 76.18 pF, the longitudinal inductance is L=1043.6 μH, and the input and output resistance is 50Ω. In actual use, set the fault type and fault variation value for simulation according to the specific conditions. The more fault variation value samples are set, the more accurate the classification effect. A part of response samples are selected as shown in FIG. 3(a) (longitudinal capacitor C fails at n=6), FIG. 3(b) (ground capacitor $C_g$ fails at n=6), and FIG. 3(c) (longitudinal inductor L fails at n=6).

Figure 4:
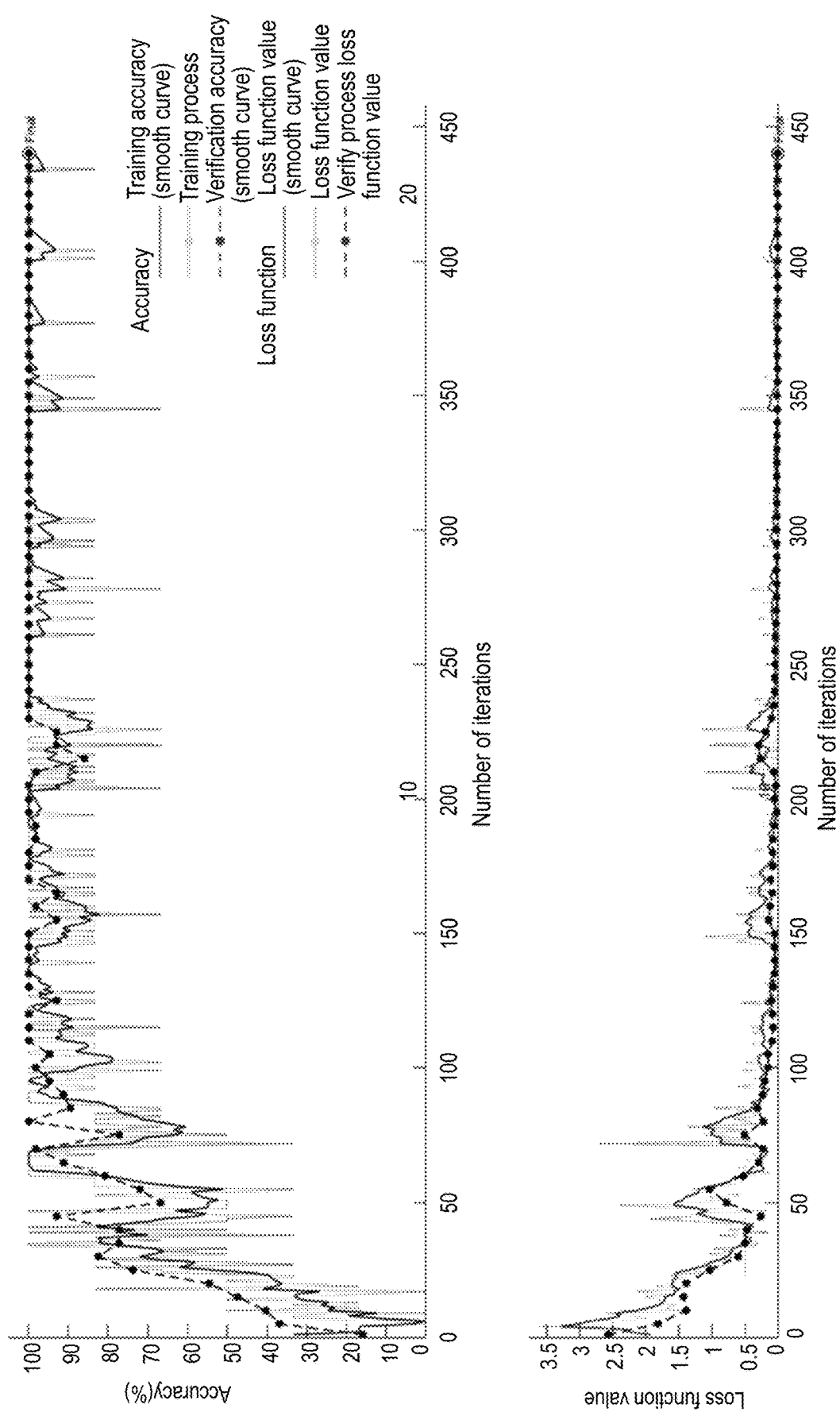
FIG. 4 is a training and verification process of a deep convolutional neural network for transformer winding fault diagnosis according to the present disclosure.
Figure 5:
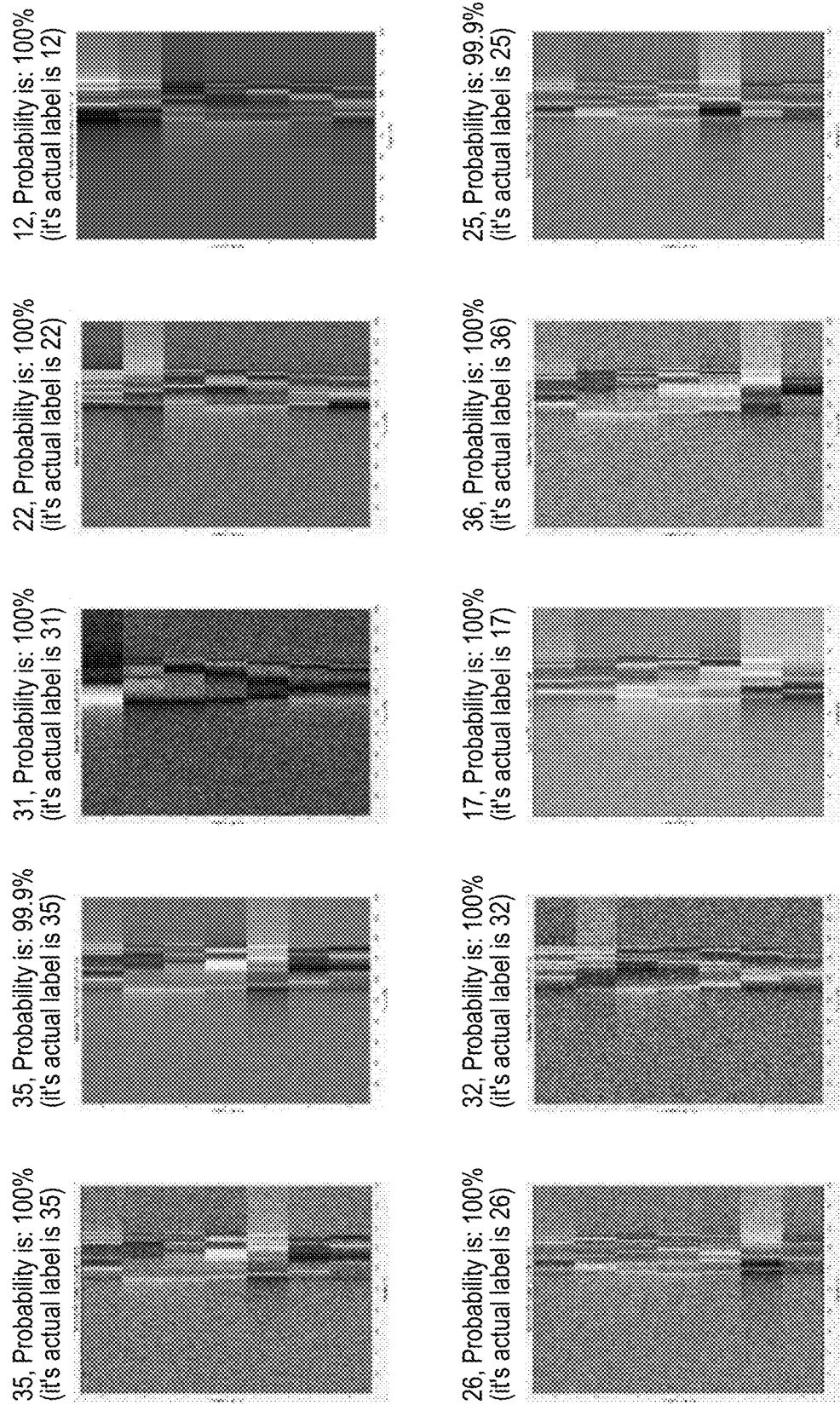
FIG. 5 is a fault identification and positioning result of the random verification data of the present disclosure and its probability value.

In order to prevent overfitting problem, data set is supplemented for performing image classification method based on deep convolutional neural network, and it is necessary to further carry out image processing to expand the data set. Therefore, the original image is randomly subjected to addition of noise, cutting transformation, rotation, mirroring, grayscale and other operations to keep the changed label unchanged. All processed images and original data are added to the deep convolutional neural network together as a training data set. The network training and verification process is shown in FIG. 4. It can be seen that with the continuous increase of the number of training iterations, the accuracy of positioning is continuously improved, and the method can correctly distinguish the type of the fault and the location of the fault. 10 verification pictures are randomly selected to show the fault classification and fault positioning results, as shown in FIG. 5, and the probability value of this type is also shown. Finally, some network parameters are frozen, and then the measured data and corresponding labels are used for training to fine-tune the deep convolutional neural network.

The network training curve (see FIG. 4) is obtained by using a deep convolution neural network to diagnose the faults of the power transformer windings. After the network has undergone 440 steps of iterative training, it is converged and can achieve 99.8% fault classification and positioning accuracy. Classification and positioning results are labeled as two-digit labels in this implementation example. In practice, it is only necessary to detect the existence and location of the fault. The fault label can be set according to the type of fault that needs to be focused on. The fault type classification is set as: 1 represents longitudinal capacitor C failure, 2 represents ground capacitor $C_g$ failure, 3 represents inductor L failure, and the fault category is the first place on the label; the transformer winding section at the fault location is numbered from 1-7. For example, 12 indicates that there is an abnormality in the longitudinal capacitance at winding number 2, and 00 indicates that the operation is in a normal state. It can be seen from the 10 verification pictures randomly selected in FIG. 5 that this solution can accurately provide the type and location of the fault. Finally, the real-time monitoring data of the transformer to be diagnosed is input into the network for verification, and the normal state and the fault state can be correctly distinguished. This method is not likely to perform simulation and training on all types of fault, but for untrained types of fault, the accuracy of identifying the fault location reaches 90%.

It should be understood that for a person of ordinary skill in the art, improvements or changes can be made according to the above description, and all these improvements and changes should fall within the protection scope of the appended claims of the present disclosure.

What is claimed is:

1. A power transformer winding fault positioning method based on deep convolutional neural network integrated with visual identification, comprising the following steps:
    1) a power transformer to be diagnosed is equivalent to a two-port network, a winding equivalent circuit is established, and a transfer function of the power transformer is calculated;
    2) for a circuit in a normal state of circuit parameters, a sine wave excitation source with a changing frequency is set at an input terminal of the power transformer winding to calculate the transfer function value at varying frequencies to obtain an amplitude-frequency characteristic curve of each winding node in the normal state;
    3) circuits under various fault statuses varied by different element parameters are subjected to scanning frequency response analysis to extract amplitude-frequency characteristics, and calculation is performed to obtain the amplitude-frequency characteristics of each winding node in different fault conditions;
    4) based on the amplitude-frequency characteristics obtained in step 2) and step 3), a frequency change amount is set as the abscissa, and different numbers of the winding node frequency scanned from an input terminal to an output terminal is set as the ordinate to establish a feature matrix;
    5) perform a scanning frequency response analysis on the power transformer to be diagnosed, obtain the amplitude-frequency characteristics, and collect historical detection data of the power transformer to form the feature matrix according to the method in step 4);
    6) the feature matrix obtained in step 4) and step 5) is converted into an image, simulation and the historical detection data of the power transformer are used as a training set, and a fault category and a fault location are used as labels, and a deep convolutional neural network is input for training;
    7) use a trained network to classify and position the fault of the transformer to be diagnosed.

2. The power transformer winding fault positioning method according to claim 1, wherein the process of calculating the transfer function in step 1) mainly comprises the following steps:
    ① select first and last node voltages $V_i$ and current $I_i$ of each winding as state variables, C is an inter-turn capacitance value, L is an inter-turn inductance value, and $C_g$ is ground capacitance, for i-th node and its adjacent node, Lerhoff's law is used as follows:

$$\begin{cases} I_i - I_{i+1} = C\dfrac{d(V_i - V_{i-1})}{dt} + C_g \dfrac{d}{dt} V_i \\ V_i - V_{i-1} = L\dfrac{d}{dt} I + RI_i \end{cases}$$

② extend step ① to all nodes, make T and Γ be a transformer winding parameter matrix, then:

$$\begin{cases} T \cdot I = C \cdot \dot{V} \\ \Gamma V = L\dot{I} + RI \end{cases}$$

③ make a node 1 be an input voltage $V_i$ and extract it when calculating the transfer function, O is a column vector when the first row is removed from C, P is the corresponding column vector of $\Gamma$, then:

$$\begin{cases} \dfrac{d}{dt}\begin{pmatrix} U \\ I \end{pmatrix} = \begin{pmatrix} 0 & C^{-1}T \\ -L^{-1}\Gamma & -L^{-1}R \end{pmatrix}\begin{pmatrix} U \\ I \end{pmatrix} + \begin{pmatrix} -C^{-1}O\dfrac{d}{dt} \\ L^{-1}P \end{pmatrix} V_1 \end{cases}$$

4 after simplification, it can be obtained that: $j\omega E \cdot X = AX + BV_1$, wherein $$X = \begin{pmatrix} U \\ I \end{pmatrix},$$

$$j\omega = \dfrac{d}{dt}, A = \begin{pmatrix} 0 & C^{-1}T \\ -L^{-1}\Gamma & -L^{-1}R \end{pmatrix}, \text{ and } C = \begin{pmatrix} -C^{-1}O\dfrac{d}{dt} \\ L^{-1}P \end{pmatrix},$$

which is converted into a frequency domain, then $$TF(\omega) = \dfrac{X}{V_1} = (j\omega E - A)^{-1} B.$$

3. The power transformer winding fault positioning method according to claim 2, wherein the calculation process of the amplitude response characteristic of the equivalent circuit of the transformer winding in step 2) — step 3) is as follows:
after inputting circuit parameters of the transformer, set a loop according to the formula in step ④, first, calculate the transfer function value under the condition that the voltage frequency at input terminal is changed from 1 to 1 MHz under normal parameters, when the fault state changes, the amplitude response for different fault types and different fault locations is calculated and obtained through two-layer loop statements.

4. The power transformer winding fault positioning method according to claim 1, wherein the process of establishing a feature matrix in step 4) is specifically as follows:
number the locations of monitoring nodes at the output terminal, and record the amplitude-frequency characteristics of the i-th node as $TF_i(\omega)$, the fault type is defined according to the actual situation and is represented by the subscript m; the fault location is the position of different nodes of the winding and is represented by the subscript n, the feature matrix of fault type m fault location n is:

$$TF_{mn} = \begin{pmatrix} TF_1(\omega_1) & TF_1(\omega_2) & \ldots & TF_1(\omega_{n-1}) & TF_1(\omega_n) \\ TF_2(\omega_1) & TF_2(\omega_2) & \ldots & TF_3(\omega_{n-1}) & TF_2(\omega_n) \\ & & \vdots & & \\ TF_i(\omega_1) & TF_i(\omega_2) & \ldots & TF_i(\omega_{n-1}) & TF_i(\omega_n) \end{pmatrix}$$

the feature matrix under normal state is recorded as $TF_{00}$.

5. The power transformer winding fault positioning method according to claim 1, wherein in step 6) the data set is trained by using a deep convolutional neural network, and a deep convolutional neural network model is used to learn data features;
a feature map obtained through the last pooling layer is used as the input of a fully connected layer, and (fault type m)×(fault location n)+1 is replaced by the total output of the fully connected layer for integration calculation;
the fault is identified through a classifier, labels of different fault categories are different fault locations and fault types.

6. The power transformer winding fault positioning method according to claim 1, wherein the frequency change of the sine wave excitation source is 1 Hz~1 MHz.

7. The power transformer winding fault positioning method according to claim 1, wherein the faults comprise longitudinal capacitor failure, vertical inductor failure, and abnormal ground capacitor.

8. The power transformer winding fault positioning method according to claim 1, wherein after the feature matrix is converted into an image, the image is subjected to image processing such as adding noise, cutting transformation, rotation, mirroring, and grayscale according to network training requirements to expand the data set to be trained.

9. The power transformer winding fault positioning method according to claim 1, wherein logarithmic processing is performed on the values in the feature matrix, if the value of a random element in the feature matrix is $x_k$, the processed value is:

$x_k' = 20 \log_{10}(x_k)$.

10. The power transformer winding fault positioning method according to claim 1, wherein in step 6), the feature matrix is drawn into a colored image according to a color bar, and the size thereof is unified.

* * * * *